United States Patent [19]
Chow et al.

[11] Patent Number: 6,128,310
[45] Date of Patent: Oct. 3, 2000

[54] MULTIPORT DATA NETWORK SWITCH HAVING A RANDOM NUMBER GENERATOR SHARED BY MULTIPLE MEDIA ACCESS CONTROLLERS

[75] Inventors: Peter Ka-Fai Chow, San Jose; Somnath Viswanath, Sunnyvale, both of Calif.

[73] Assignee: Advanced Micro Devices, Inc., Sunnyvale, Calif.

[21] Appl. No.: 08/993,780

[22] Filed: Dec. 18, 1997

Related U.S. Application Data

[60] Provisional application No. 60/038,025, Feb. 14, 1997.

[51] Int. Cl.[7] .................................................. H04L 12/413
[52] U.S. Cl. ........................................ 370/448; 370/462
[58] Field of Search .................................. 370/445, 446, 370/447, 448, 462, 463, 401

[56] References Cited

U.S. PATENT DOCUMENTS

| | | | |
|---|---|---|---|
| 4,409,592 | 10/1983 | Hunt | 340/825.5 |
| 4,623,886 | 11/1986 | Livingston | 340/825.5 |
| 4,774,707 | 9/1988 | Raychaudhuri | 370/447 |
| 5,515,376 | 5/1996 | Merthy et al. | |
| 5,568,476 | 10/1996 | Sherer et al. | 370/236 |
| 5,600,651 | 2/1997 | Molle | 370/448 |
| 5,625,825 | 4/1997 | Rostoker et al. | 710/242 |

FOREIGN PATENT DOCUMENTS 0 616 449 A2   12/1997   European Pat. Off. .

OTHER PUBLICATIONS

Wright, M. "Network–switch ICs simplify design and slash per–port costs" EDN–Electrical Design News, vol. 40, No. 24, Nov. 23, 1995, pp. 53–56, 58, 60 XP000546015.

*Primary Examiner*—Chau Nguyen
*Assistant Examiner*—Suibel M. H. Schuppner

[57] ABSTRACT

A multiport data network switch with each port associated with a media access controller (MAC) that is allocated a time slot in a repetitive sequence of clock cycles. A random number generator is coupled in common to each MAC to output a random number signal thereto. In response to a collision indicating signal, received at a port during a data transmission, the MAC outputs a retransmission retry signal in accordance with the random number signal that represents a number of delay cycles in which said transmission is delayed. The random number signal generator outputs an increasing multibit signal that is periodically reset. The MAC associated with each port is coupled in common to the shared random number signal generator and gains access thereto at a different respective time slot.

15 Claims, 5 Drawing Sheets

MULTIPORT DATA NETWORK SWITCH HAVING A RANDOM NUMBER GENERATOR SHARED BY MULTIPLE MEDIA ACCESS CONTROLLERS

RELATED APPLICATIONS

This application claims priority from provisional patent application Ser. No. 60/038,025, filed Feb. 14, 1997, the entire disclosure of which is hereby incorporated by reference herein.

TECHNICAL FIELD

The present invention relates to a data network switch and, more particularly, to communication contention mediation among a plurality of media access controlled ports.

BACKGROUND ART

A multiport data network switch permits data communication among a plurality of media stations in a local area network. Each station in the network is associated with a port of the switch. Data frames, or packets, are transferred between stations by means of data network switch media access control (MAC) circuitry, or "engines," for each switch port. The network switch passes data frames received from a transmitting station to a destination station based on the header information in the received data frame. The switch can link the network to other networks through a router connected to one or more switch ports.

The MAC circuitry for each port must resolve contentions for traffic communication and data collisions among network stations. For example, the ISO 8802 (IEEE/ANSI 802.3) Standard specifies a carrier-sense multiple access with collision detection (CSMA/CD) interface to listen for traffic on the media. Collision detection is performed by the media devices and reported to the MAC engines. Detection of collision will cause the transmission of data to be rescheduled to a time determined by a random backoff algorithm specified by the ISO Standard. Thus, at the end of enforcing a collision, the CSMA/CD sublayer delays before attempting to re-transmit the frame. The delay is an integer multiple of slot time. The number of slot times to delay before the nth re-transmission is to be chosen as a uniformly distributed random integer. Conventional network switches typically provide a random number generator within the MAC engine at each port to generate the collision backoff interval.

As data networks become more robust, the demand grows for a greater number of switch ports and the capacity to handle the increase in network stations and density of data traffic. The resulting operational complexities impose challenges to the design of semiconductor hardware. Integration of the switch functionalities on a single multiport chip makes efficient use of chip architecture even more critical. If similar functions are executed at each of a plurality of ports, then discrete provision of similar circuitry at each port should be avoided if possible. The need exists to identify those switch port functions that can be performed by shared common integrated chip elements and to provide appropriate implementation to eliminate any unnecessary redundancies.

DISCLOSURE OF THE INVENTION

The present invention addresses the above noted needs and drawbacks of current network switches in part by providing a multiport switch with each port containing a media access controller (MAC) that is allocated a time slot in a repetitive sequence of clock cycles. A random number generator is coupled in common to each MAC to output a random number signal thereto. In response to a collision indicating signal, received at a port during a data transmission, the MAC outputs a retransmission retry signal in accordance with the random number signal that represents a number of delay cycles in which said transmission is to be delayed.

The random number generator preferably is a free running counter synchronized to a fixed frequency clock source. The counter is periodically restarted in accordance with a repetitive pulse signal having a frequency less than the frequency of counter roll over. The random number signal generator outputs an increasing multibit signal that is periodically reset. Each MAC is coupled in common to the shared random number signal generator and gains access thereto at a different respective time slot. Thus a different random number is applied to each MAC.

Each MAC preferably includes a retry counter that is incremented upon receipt of a collision signal and each successive received collision signal upon transmission retry. A multibit mask register in the MAC permits the MAC to mask a specific number of bits of the received random number signal that is applied to a delay count register. The number of cycles to be delayed until transmission for that port is retried is set in accordance with the count in the delay count register. For each successive increment of the retry counter, a greater number of bits of the random number signal is provided to the delay count register so that the probability of the number of cycles to be delayed increases accordingly.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

BEST MODE FOR CARRYING OUT THE INVENTION

Figure 1:
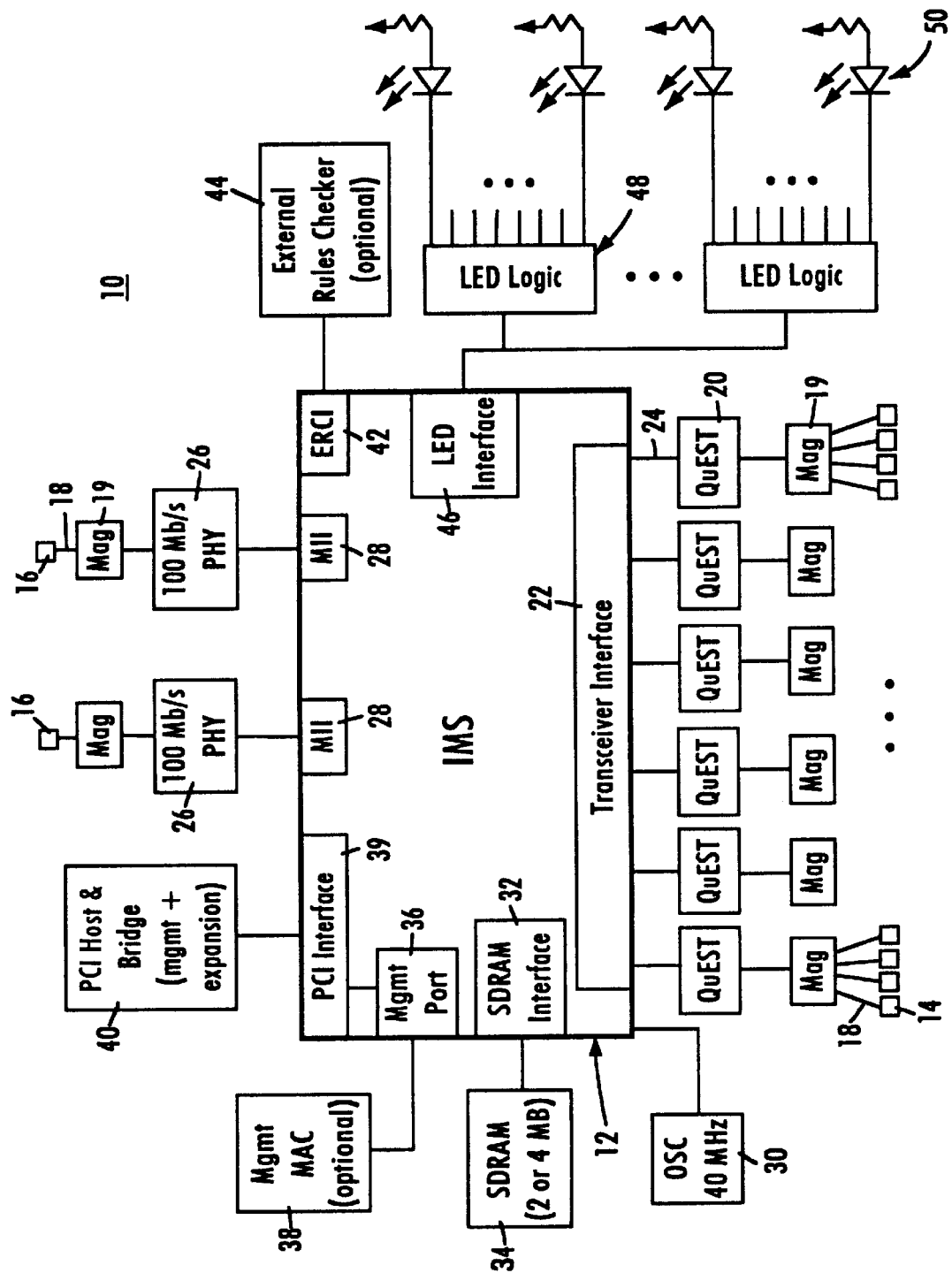
FIG. 1 is a block diagram of a packet switched system in accordance with an embodiment of the present invention.

The present invention is exemplified herein in a packet switched network environment, such as an Ethernet (IEEE 802.3) network. From the following detailed description it should be apparent that the present invention, illustrated as system 10 in the block diagram of FIG. 1, is also applicable to other packet switched systems. The packet switched network includes an integrated multiport switch (IMS) 12 that enables communication of data packets between network stations. The network stations may have different configurations. In the current example, twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 may include an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3× Full-Duplex with Flow Control—Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20, labelled QuEST, that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, as described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 Mhz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices.

The multiport switch 12 includes an internal decision making engine that selectively transmits data packets received from one source to at least one destination station. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2:
FIGS. 2, 2A and 2B show block diagrams of a multiport switch used in the packet switched system of FIG. 1.
Figure 2A:
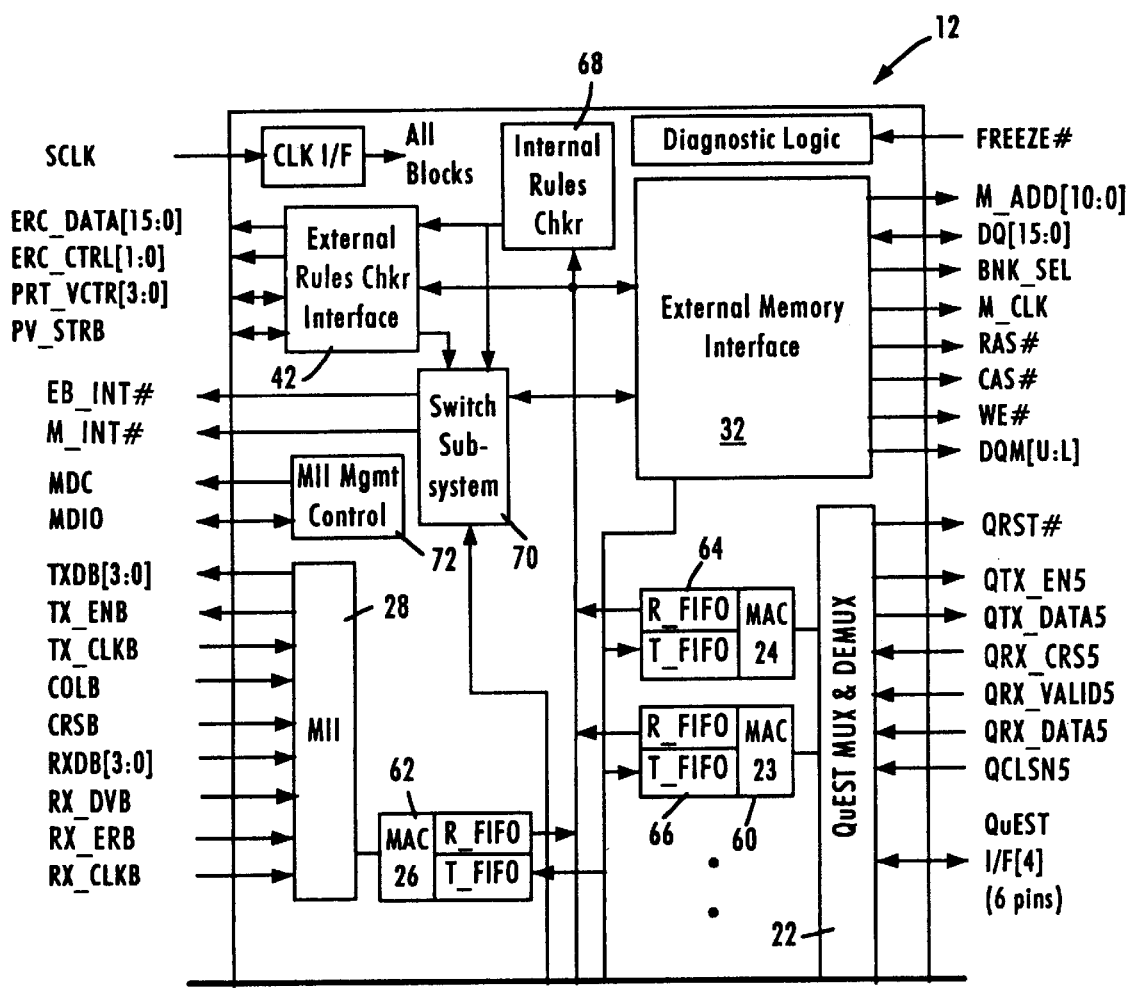
Figure 2B:
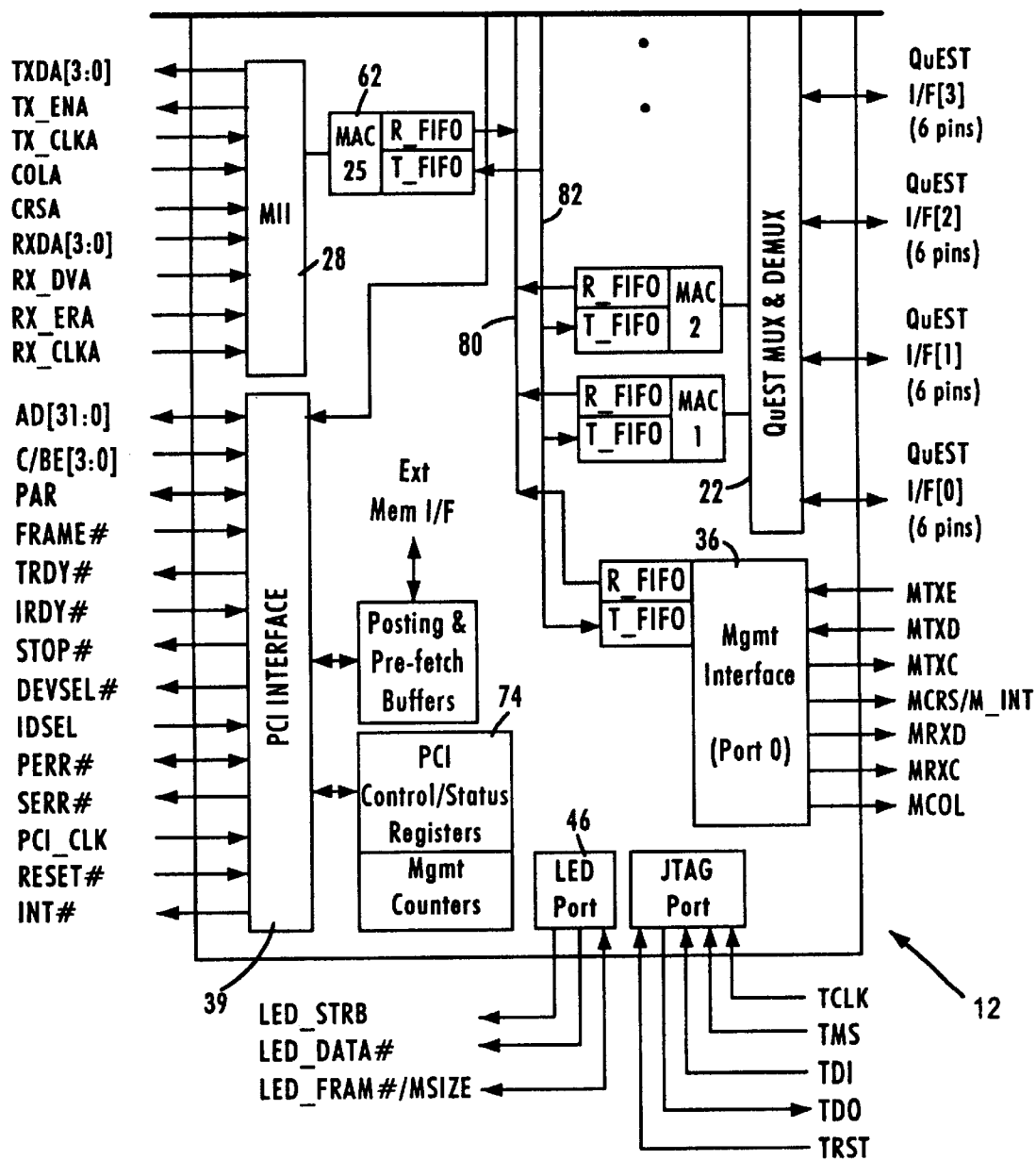

FIG. 2 is a more detailed block diagram example of the multiport switch 12 shown in FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO buffer 66. Data packets from a network station are received by the corresponding MAC port and stored in the corresponding receive FIFO buffer 64. The received data packet is output from the corresponding receive FIFO buffer 64 to the external memory interface 32 for storage in the external memory 34.

The header of the received packet is also forwarded to a decision making engine, comprising an internal rules checker 68 and an external rules checker interface 32, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The internal rules checker 68 and external rules checker 44 provide the decision making logic for determining the destination MAC port for a given data packet. The decision making engine may indicate that a given data packet is to be output to either a single port, multiple ports, or all ports (i.e., broadcast). Each data packet includes a header having source and destination address, in accordance with which the decision making engine can identify the appropriate output MAC port(s). The destination address may correspond to a virtual address, in which case the decision making engine identifies output ports for a plurality of network stations. Alternatively, a received data packet may include a VLAN (virtual LAN) tagged frame according to IEEE 802.1d protocol that specifies another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface 72 also outputs a management data clock (MDC) providing a timing reference on the bidirectional management data IO (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
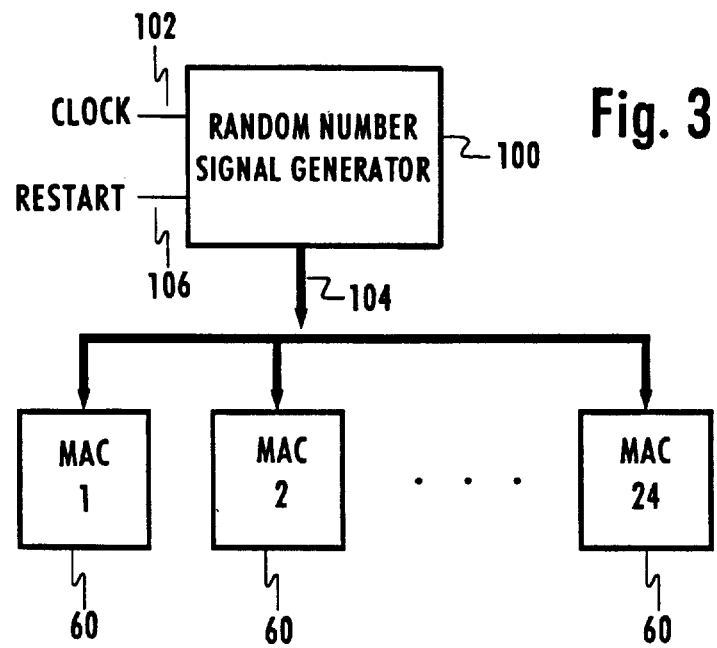
FIG. 3 is a partial block diagram of a shared random number signal generator in accordance with the invention.

FIG. 3 is a block diagram that broadly illustrates the relationship among the shared random number signal generator and the twenty four 10 Mb/s port MACs of the illustrative embodiment of FIG. 2, in accordance with the present invention. Random number signal generator 100 is preferably a free running counter that increments with each successive cycle of the fixed frequency clock source signal received at clock input 102. In the preferred switch example shown in FIG. 2, the clock signal has a frequency of 80 Mhz. The preferred random number signal generator has a twenty two bit capacity. Thus, with the counter free running without external reset, the counter will count up to $2^{22}$ clock cycles before zeroing all its bits. Restart input 106 permits the clock to be reset by an external signal before a complete count sequence has been attained. The output of random number signal generator is fed to a common bus 104 to which each of the MACs 60 is coupled. The MACs may gain access to the random number signal generator output during respective allotted time slots in the recurring sequences of clock signals.

Figure 4A:
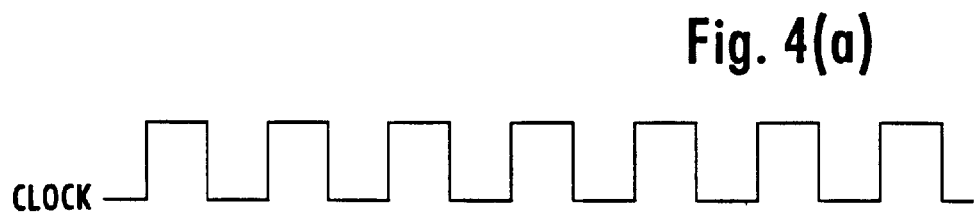
FIGS. 4(a), 4(b) and 4(c) are timing diagrams respectively of a fixed clock cycle waveform, a restart waveform, and the effect of these waveforms on the random number signal generator in accordance with the present invention.
Figure 4B:
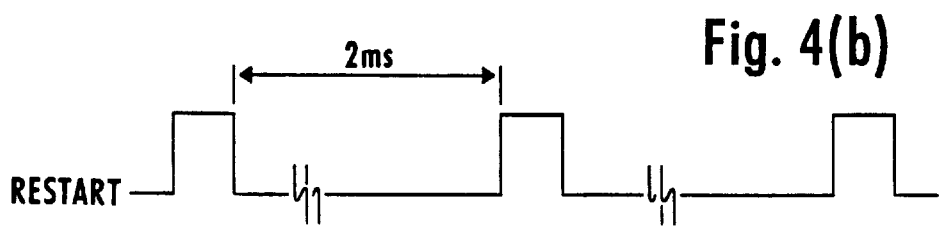
Figure 4C:
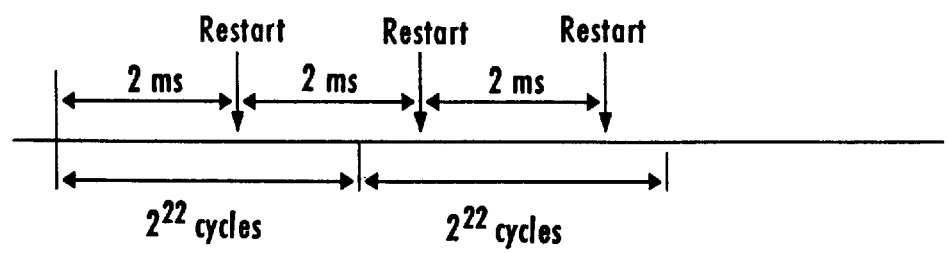

FIG. 4(*a*) is a timing waveform of the clock signal applied at the first random number signal generator input 102. For a twenty two bit counter, continual incrementation for each clock cycle would require $2^{22}$ clock cycles of the 80 Mhz clock for the counter to reach its original zeroed state. To effect an even more random output generation, the restart signal, illustrated in FIG. 4(*b*) is applied to reset input 106 of the counter. The restart signal as shown in the example is a regularly recurring pulse signal in which pulses are separated by 2 ms. As shown in the waveform of FIG. 4(*c*), the period between restart pulses is considerably greater than the period of one 80 Mhz cycle but less than a complete count sequence of $2^{22}$ clock cycles. The count of the random number signal generator thus will be interrupted and restarted before completely recycling. The count is zeroed at that time and again will be restarted when the next restart pulse arrives. The repeating count sequence thus will include 80 Mhz. pulses for 2 ms in the preferred example. While the restart signal is exemplified by a constant time period between pulses, this period may be made variable, whereby the count at the time of restart likewise will vary.

Figure 5:
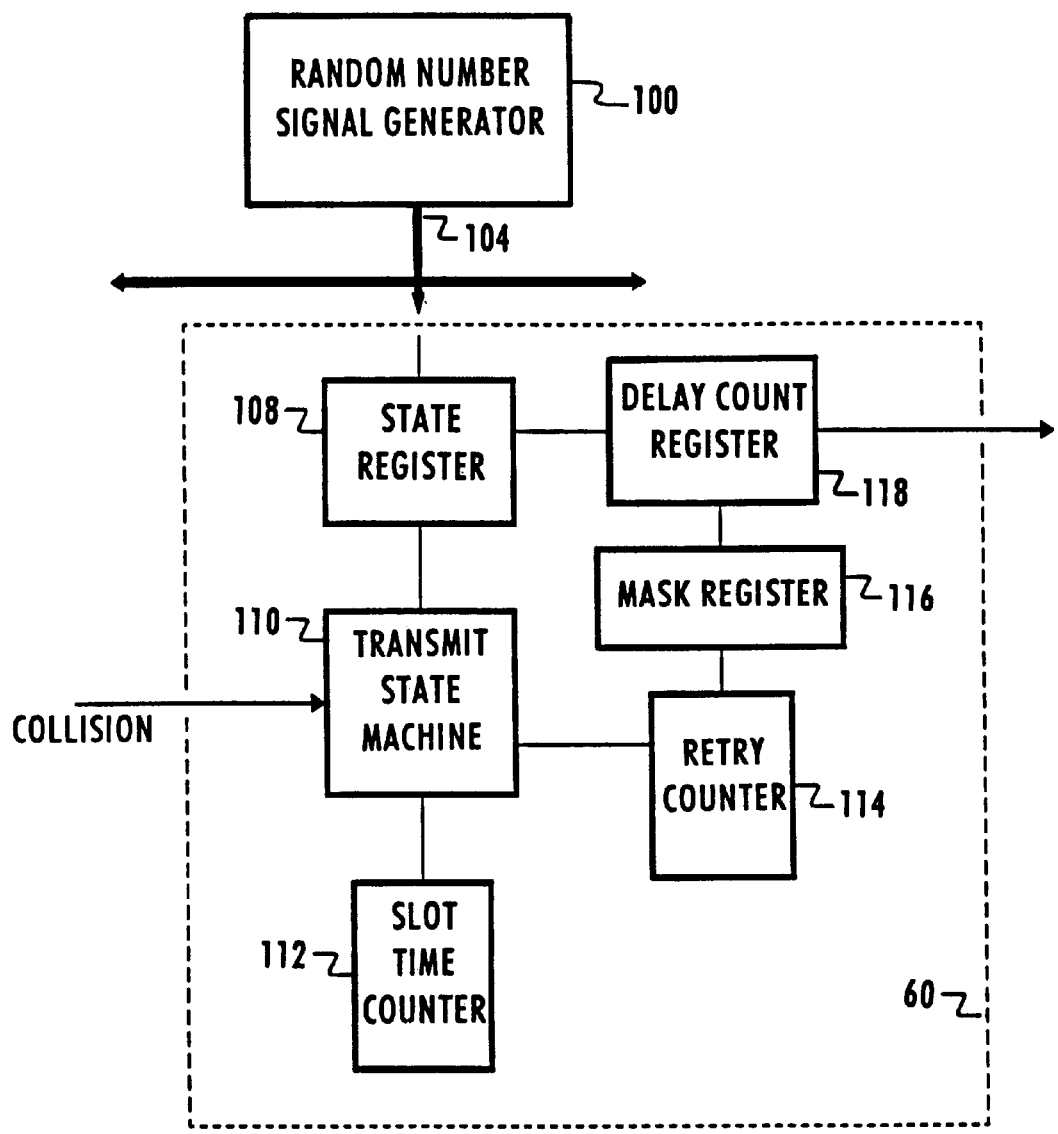
FIG. 5 is a partial block diagram of the random number signal generator and the media access controller elements that interact for collision mediation according to the present invention.

FIG. 5 is a block diagram in accordance with one embodiment of the present invention in which random number generator 100 is shown coupled to MAC 60 through common bus 104. It is to be understood that a similar coupling exists for all 0.10 Mb/s MAC ports for the embodiment shown in FIG. 2. Each MAC includes integrated logic circuitry for handling a multitude of functions. For simplicity of illustration only those elements that effect transmission retries in response to collision sensing are shown within the dotted line box in this drawing figure. State register 108 is connected to common bus 104, to which the random number signal is applied. MAC transmit state machine 110 has a first input for receiving a collision indicating signal from the port media. The transmit state machine is also connected to slot time counter 112, state register 108, and retry counter 114. Mask register 116 is connected to the retry counter 114 and delay count register 118. The delay count register 118 is connected to the state register 108 and provides a delayed retransmission signal output.

In operation, a transmission collision indicating signal is received at the transmit state machine. Transmission must be interrupted and delayed for a number of slot cycles in accordance with the generated random number. Upon reaching the next allotted slot time for the MAC, as determined from the slot time counter, the transmit state machine signals the state register to sample the random number signal generated during that cycle. Preferably ten bits of the twenty two bit random number signal is then input to the state register. In response to the receipt of the collision indicating signal, the transmit state machine also increments retry counter 114. The output of the retry counter is applied to mask register 116. Each increment of the retry counter shifts the mask register. Logic within the delay count register accepts the sampled ten bit random number signal, as well as the mask register output. The mask register output is an integer that is determinative of the number of bits, of the ten bit random number signal that is input to the count register, that will be stored for output. The output retransmission signal indicates a delay for a number of slot time cycles for that MAC that corresponds to those stored bits. The range of possible delay cycles is dependent upon the number of stored bits indicated by the mask register. The number of delay slot time cycles will be less than $2^n$, where n is the number of digits of the random number signal applied to the delay count register. As this number increases, the likelihood of a lengthier delay increases accordingly.

If the transmission retry has been successful without collision, the retry counter and mask register are reset. For each successive retry that has not been successful, another collision indicating signal will be received. A new random number signal is then sampled by the state register. The retry counter is incremented and the mask register is then shifted to increase by one the number of bits of the new random number signal to be stored in the delay count register for output. The MAC is preferably programmed to set a maximum number of successive retries. Upon termination of retries, the retry counter and mask register are reset.

This operation is operable for each of the twenty four MAC ports of the illustrated embodiment of FIG. 2. A plurality of MACs may concurrently be in varying states of transmission retry delay. These MACs will have accessed the random number generator during their respective slot times in the same or different clock sequences. The numbers represented by the random signal generator output are thus random with respect to the plurality of MACs, the resulting delays being independent of each other.

The present invention thus provides the capability of sharing random number generation by a plurality of media access controllers for respective ports without dedication of a separate random number generator for each port. Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein. For example, rather than providing a separate MAC state machine for each port, economy of chip architecture can be furthered by a MAC state machine that is time shared by a plurality of ports. Such a provision is described in the commonly assigned copending application Ser. No. 08/992, 921, filed Dec. 18, 1997. In that embodiment, the collision signal would identify the port at which collision has been detected. This port is associated in the shared MAC state machine with its time slot allocation so that the appropriate functions for each port can be performed during the respective time slots and maintained independently.

We claim:

1. An integrated multiport network switch for interfacing with a data network to transmit data to and receive data from network stations via said data network, comprising:

a plurality of ports, each associated with at least one of said network stations, each said port containing a media access controller (MAC) that is allocated a time slot in a repetitive sequence of clock cycles: and a random number generator coupled in common to each said MAC to output a random number signal thereto; and wherein each said MAC comprises outputting means responsive to a collision indicating signal during a data transmission for outputting a retransmission signal in accordance with said random number signal that represents a number of delay cycles in which said transmission is delayed; and wherein said random number generator is a multiple bit counter comprising:

a first random number generator input coupled to a fixed frequency clock signal;

a second random generator input coupled to a reset signal; and a random generator output connected to a bus that is time shared in common by each of said MACs.

2. An integrated multiport network switch as recited in claim 1, wherein said outputting means comprises:

a retry counter having a retry counter input coupled to receive said collision indicating signal and a retry counter output;

a multibit mask register having a mask register input coupled to said retry counter output and a mask register output; and a delay count register having a first delay count register input connected to receive said random number signal, a second delay count register input connected to said mask generator, and a delay count register output for conveying said retransmission signal.

3. An integrated multiport network switch as recited in claim 1, wherein said second random generator input is connected to a repetitive pulse signal source having a frequency lower than a frequency of a counter roll over.

4. In a data network switch having a plurality of ports for transmitting data frames to and receiving data frames from a data network in synchronism with a fixed frequency clock source, a method for mediating data transmission collision upon receiving a collision signal at one of said ports, comprising the steps of:

generating a random number signal representing a random number;

coupling said random number signal in common to all of said ports;

applying said random number signal to said port in response to reception therein of said collision signal;

delaying transmission of data at said port for a number of clock cycles that corresponds to said random number; and retrying transmission of data for said port upon termination of the delayed number of cycles in said delaying step.

5. A method as recited in claim 4, wherein said random number signal is a multibit signal and said delaying step comprises:

masking said multibit signal to obtain a resultant signal that is limited to a specified number of bits of said multibit signal, said delayed number of cycles being equal to the random number represented by the resultant signal.

6. A method as recited in claim 4, wherein said method further comprises the steps of repeating said applying step, delaying step and retrying step upon receipt of subsequent collision signals during successive transmission retries.

7. A method as recited in claim 6, wherein said random number signal is a multibit signal and said delaying step comprises:

masking said multibit signal to obtain a resultant signal that is limited to a specified number of bits of said multibit signal, said delayed number of cycles being equal to the random number represented by the resultant signal.

8. A method as recited in claim 7, wherein said masking step comprises increasing the number of bits of said multibit signal in said resultant signal for each successive collision retry.

9. A method as recited in claim 8, further comprising the steps of:

setting a maximum number of successive transmission retries in which collision occurs;

counting the number of successive transmission retries; and aborting transmission at said port upon exceeding said maximum number of successive retries.

10. A method as recited in claim 7, wherein said generating step comprises;

continuously counting cycles of a fixed clock source;

restarting counting in said counting step at regular time intervals that exceeds the period of said fixed clock source.

11. In a data network switch having plurality of ports with corresponding media access controllers (MACs) for transmitting data frames to and receiving data frames from a data network in synchronism with a fixed frequency clock source, a method for mediating data transmission collision comprising the steps of:

allocating to each of said MACs access to a random number signal during a specified time slot in a repeating sequence of clock cycles;

in response to reception of collision signals at a plurality of said MACs, applying to each of said plurality of MACs during its allocated time slot said random number signal, said random number signal representing a random number respective of each said MAC;

delaying transmission of data at the ports of said plurality of MACs for a number of clock cycles that corresponds to said respective random number for each MAC; and retrying transmission of data for each port in said delaying step upon termination of the respective delayed number of cycles.

12. A method as recited in claim 11, wherein each said random number signal is a multibit signal and said delaying step comprises:

masking each said multibit signal in said applying step to obtain a respective resultant signal that contains a specified number of bits of said multibit signal, said delayed number of cycles being equal to the random number represented by the resultant signal.

13. A method as recited in claim 12, wherein said method further comprises the steps of repeating said applying step, delaying step and retrying step upon receipt of subsequent collision signals during successive transmission retries.

14. A method as recited in claim 13, wherein said masking step comprises increasing the number of bits of said multibit signal in said resultant signal for each successive collision retry.

15. A method as recited in claim 13, further comprising the steps of:

setting a maximum number of successive transmission retries for each port for which collision occurs;

counting the number of successive transmission retries at each port; and aborting transmission at each port upon exceeding said maximum number of successive retries.

\* \* \* \* \*